United States Patent [19]

Keller

[11] Patent Number: 4,719,461
[45] Date of Patent: Jan. 12, 1988

[54] METHOD OF SELECTIVE CONTROL OF ELECTRICAL CIRCUITS AND A CIRCUIT ARRANGEMENT FOR CARRYING OUT THE METHOD

[75] Inventor: Herbert Keller, Übersee, Fed. Rep. of Germany

[73] Assignee: Wilhelm Ruf KG, Munich, Fed. Rep. of Germany

[21] Appl. No.: 866,467

[22] Filed: May 22, 1986

[30] Foreign Application Priority Data

May 24, 1985 [DE] Fed. Rep. of Germany ....... 3518827

[51] Int. Cl.$^4$ ........................... H04Q 1/20; H04Q 1/39
[52] U.S. Cl. ................................. 340/825.57; 377/52; 328/75
[58] Field of Search ....................... 340/825.57, 825.65, 340/825.62; 377/80, 81, 106, 107, 110, 52, 55; 328/62, 72, 75; 307/244, 463

[56] References Cited

U.S. PATENT DOCUMENTS 4,158,767  6/1979  Long ..................................... 377/52
4,543,575  9/1985  Liermann ......................... 340/825.63

OTHER PUBLICATIONS

Datenblatt der Fa. Intersil ICM 7226 A/B, 3/79, Firmendruckschrift der Fa. Spezial-Elektronik KG FU 7226 B (4) 80.
273 Schaltungen, Elektro-Verlag GmbH 4, Auflage, Beiträge 203, 212, 224, "Elektor", Sep. 1979, Seiten 930 bis 933.

Primary Examiner—Donald J. Yusko
Attorney, Agent, or Firm—Helfgott & Karas

[57] ABSTRACT

In an effort to reduce the number of "terminal legs" in highly integrated electronic circuits, two different kinds of coded signals are applied successively to the control terminals thereof, namely: binary coded signals applied in parallel and successive pulses. An evaluation is made only of pulses applied to selected terminals, and a different number of pulses is applied to the individual control terminals. The total number of pulses evaluated is counted in a counter. The counter outputs are decoded in a decoder. The binary coded signals also are decoded in a decoder, and the outputs of both decoders are combined in a selection logic so that both kinds of signals together define a control state. In this manner $3^n$ different control states are obtained by a number n of control terminals.

8 Claims, 5 Drawing Figures

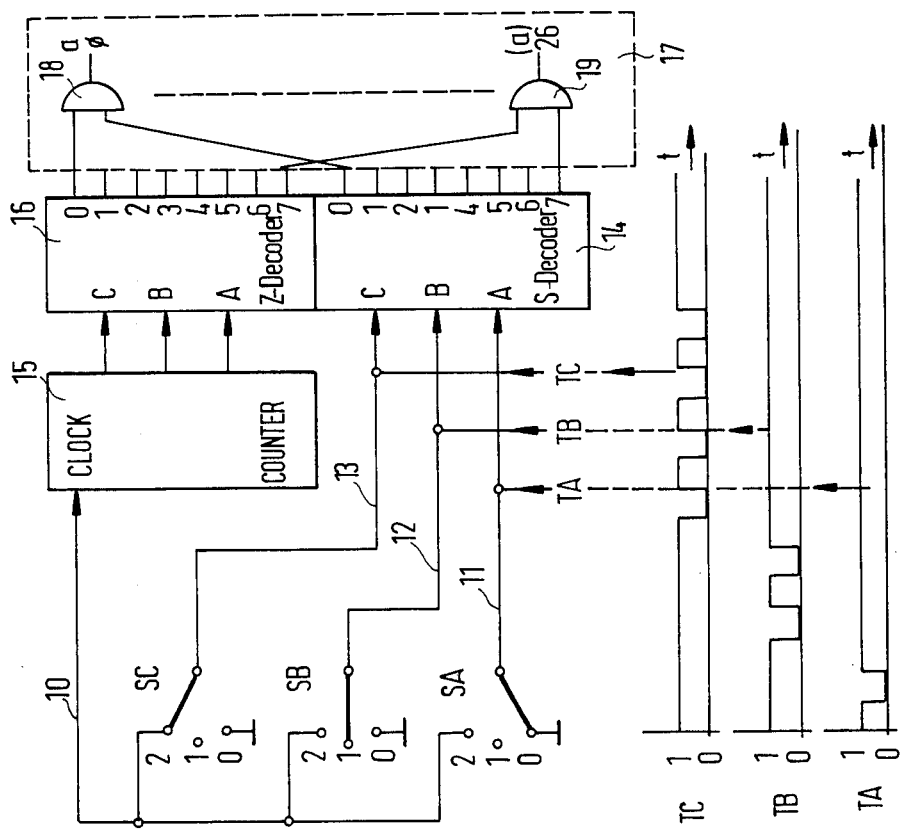

METHOD OF SELECTIVE CONTROL OF ELECTRICAL CIRCUITS AND A CIRCUIT ARRANGEMENT FOR CARRYING OUT THE METHOD

DESCRIPTION

1. Field of the Invention

The instant invention relates to a method of selective control of electrical circuits comprising a number n of control terminals, logical signals (0/1) being applied to each control terminal upon selection thereof. The invention also relates to a circuit arrangement for carrying out the method, including a circuit to be controlled which has a number n of control terminals and a first decoder connected to the circuit.

BACKGROUND OF THE INVENTION

In highly integrated circuits nowadays the packing density achieved is so great that it becomes difficult to provide the circuit casing with the required number of "terminal legs".

For instance, at present integrated circuits are being used which comprise a great number of (internal) different functional groups of which only selected ones, however, are to be active during normal operation. The desired functional group at present is activated by external circuitry associated with individual "terminal legs". This external circuitry may be embodied by fixed wiring by means of which certain terminals are placed at certain potentials (logical 0 or logical 1). Instead of fixed wiring also mechanical or electrical switches may be used.

A reduction of the required number of "terminal legs" is obtained by applying coded signals to the control terminals for the selection of certain structural groups. The signals may be binary coded and the integrated circuit in that event comprises an internal decoder. In this manner two possibilities of selection may be realized by a number n of terminal legs.

SUMMARY OF THE INVENTION

It is an object of the instant invention to improve a method and a circuit arrangement of the kind specified initially such that a greater number of possibilities of selection is obtained at the same number of control terminals or, vice versa, that a smaller number of control terminals is required for the same number of possibilities of selection.

BRIEF DESCRIPTION OF THE DRAWING

The invention will be described further, by way of example, with reference to the accompanying drawing, in which:

FIG. 1 is a block diagram of a circuit arrangement according to the invention;

FIG. 2 is a selection table of the switching states to be realized by the circuit arrangement shown in FIG. 1;

In the various figures the same reference numerals are used for elements which are identical or correspond to each other.

DESCRIPTION OF PREFERRED EMBODIMENTS

Figure 3:
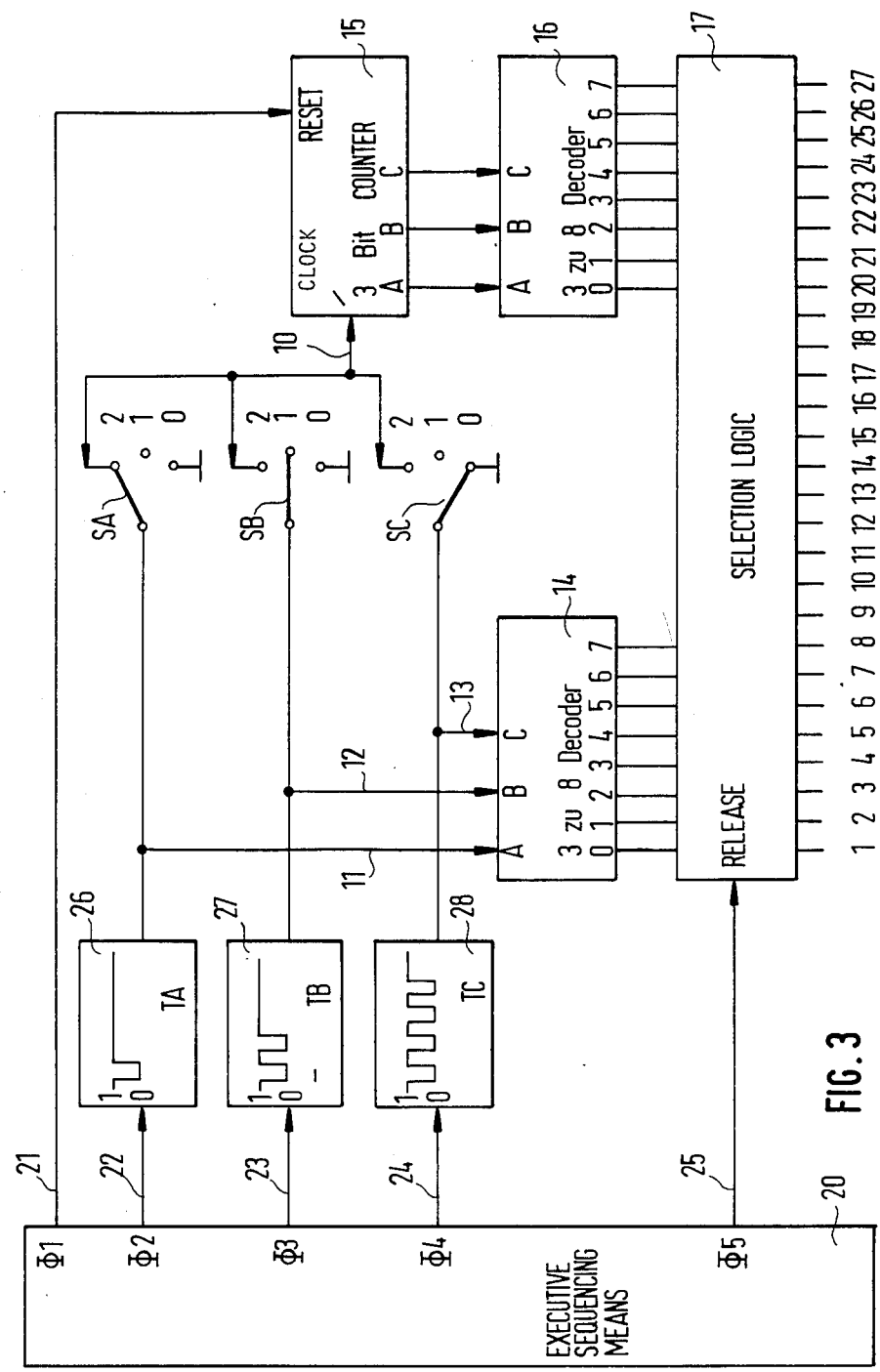
FIG. 3 is a more detailed block diagram of the circuit arrangement according to the invention.

All embodiments relate to a circuit arrangement including n=3 control terminals by which $3^n=27$ possibilities of selection may be realized. Of course, the number n may be selected at random.

As shown in FIG. 1, three switches SA, SB, and SC are provided which each may adopt three different switching positions marked 0, 1, and 2, respectively. All terminals marked 0 are connected to ground, all terminals marked 1 are free of potential, all terminals marked 2 are connected to a common bus 10 which will be discussed in greater detail below.

Those terminals of the switches connected to the switch arm of switches SA, SB, and SC, respectively, are connected to control leads or control terminals 11, 12, or 13, respectively, of the integrated circuit to be controlled. Furthermore, these control terminals or leads 11, 12, and 13 each are connected to a respective input A, B, or C of a first decoder 14 having three (or in general n) inputs and eight (or in general $2^n$) outputs in the instant case marked by numbers 0 to 7. This decoder 14 serves to decode the binary coded signals applied to switches SA, SB, and SC, respectively, forming a single output signal on one of the output lines. This means that the decoder 14 samples the states of the switches in parallel.

For this reason it is designated "S decoder" in the drawings, "S" representing "switch".

Furthermore pulses TA, TB, and TC, respectively, in accordance with the pulse trains shown in the bottom part of FIG. 1 may be applied to the terminals 11, 12, and 13, respectively. Different numbers of negative pulses are applied staggered in time to the individual terminals 11, 12, and 13. In the embodiment shown one pulse is applied to terminal 11, two pulses are applied to terminal 12, while four pulses are applied to terminal 13.

If the code applied is not biunique (reversible one to one relationship in the mathematical sense), it is convenient to avoid ambiguities by selecting the number of pulses applied to the individual terminals such as to correspond to the weight of the bit positions of the corresponding responding code. Therefore, in general the nth line will carry $2^n$ pulses. These pulses come from pulse generators which will be explained in greater detail below. What is important is that the pulses for the individual terminals are staggered or offset in time so that they do not overlap. In the embodiment shown "negative" pulses are used and this means that a logical 1 or high potential is associated with the inoperative state, while a single pulse is characterized by the logical state 0 or by low potential. By way of the terminals or lines 11, 12, and 13 as well as the switches SA, SB, and SC, depending on the switching state thereof - these pulses are applied to the bus 10, provided the associated switch is in the position marked "2". In the embodiment shown in FIG. 1 this is the case with switch SC so that four pulses (TC) reach the bus 10. The bus 10 is connected to a counting input of a counter 15 embodied by a binary counter in the embodiment illustrated. Consequently the counter 15 has n=3 outputs which are connected to three inputs A, B, and C of a second decoder 16. This decoder 16 decodes the counter outputs and thus is marked Z decoder in the drawings, the character "Z" marking the "counter". The structure and function of this decoder correspond to that of the first decoder 14.

No matter what the positions of switches SA, SB, and SC, the two decoders 14 and 16 always have a logical 1 at one of their eight outputs only. As certain pairs of logical 1 cannot occur at the outputs of the two decoders 14 and 16, a total of $3^n = 27$ possible pairs of logical 1 are the result. (For example, the following pair of logical 1 cannot occur: first decoder 14=1 and second decoder 16=7. For the second decoder 16 to be in condition "7", all three switches SA, SB, and SC would have to be in their switching position "2". However, this would mean that also the first decoder 14 would have to be in condition "7", etc. In general, the decimal number of the figure decoded by the second decoder 16 only may be smaller than or equal to the corresponding number of the first decoder, but never greater, in the case of the embodiment shown in FIG. 1.)

The $2^n$ outputs of the two decoders 14 and 16 are combined in a selection logic 17 in correspondence with the possible combinations illustrated in the table of FIG. 2. The selection logic in this case is represented by 27 AND gates 18, 19. This means that the selection logic 17 has 27 outputs marked a0 to a26. A single one only of these outputs thus has a logical 1 depending on the position of switches SA, SB, and SC, and this is the means of selecting a certain structural group or function of the integrated circuit.

The table listed in FIG. 2 includes all possible combinations of the switching positions of the three switches SA, SB, and SC as well as the corresponding states adopted by the two decoders 14 and 16, and the corresponding activated output a of the selection logic 17. This clearly shows that n switches each of which may adopt one of three different states permit $3^n$ possible conditions in practice.

FIG. 3 is a more detailed block diagram of the circuit arrangement shown in FIG. 1.

In addition to the functional blocks presented in FIG. 1, FIG. 3 also shows an executive sequencing means 20 which in this case has five output lines 21 to 25. Control signals Φ1 to Φ5 appear one after the other on these output lines, whereby the sequence in time of the individual functions is controlled. The output line 21 is connected to a reset input of the counter 15. The output lines 22, 23, and 24 each are connected to a control input of a pulse transmitter 26, 27, 28, respectively, these pulse transmitters supplying the number mentioned of (negative) pulse TA, TB, and TC for the switches SA, SB, and SC, respectively. The sequencing of the signals Φ2, Φ3, and Φ4 is such that first pulse transmitter 26, then pulse transmitter 27, and finally pulse transmitter 28 generate their respective given number of pulses. It may be taken also from the block diagram of FIG. 3 that the first decoder 14 samples the states of switches SA, SB, and SC in a parallel procedure or so to speak statically. It should further be noted that the pulse generators 26, 27, and 28 when in their "inoperative state", carry a logical 1 so that a logical 1 is applied to terminals 11, 12, and 13 also when the switches SA, SB, and SC, respectively, are in switching state "1" or "2". Furthermore, it may be seen that the output pulses of the pulse generators 26, 27, and 28 are applied to the counter 15 only through switches which are in switching state "2".

As regards the executive sequencing means 20 it should further be noted that signals Φ1 to Φ5 occur in the order of their numbering, i.e. at first counter 15 is reset to 0 and then the pulse generators 26, 27, and 28 are activated one after the other, and finally signal Φ5 appearing on line 25 releases the selection logic 17. Consequently the selection logic 17 does not provide an output signal until it has been made sure that counter 15 has counted all pulses of interest to this counter. Of course, also the states of the first decoder 14 change during the activity of the pulse generators 26, 27, and 28. However, as soon as the counting pulses have been completed and signal Φ4 has been terminated, the decoder samples the conditions of switches SA, SB, and SC and, having decoded them, passes them on to the selection logic 17.

Figure 4:
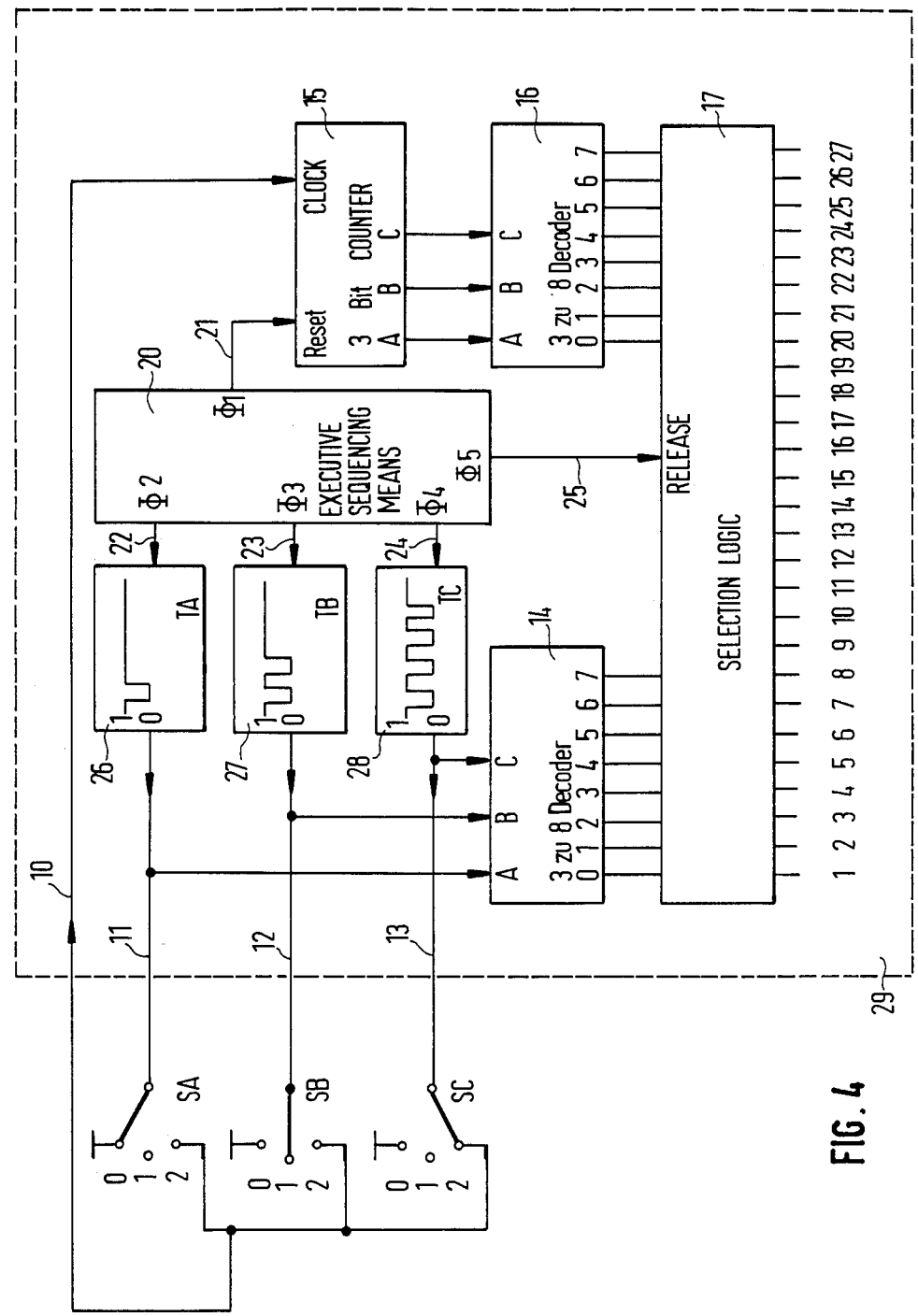
FIG. 4 is a block diagram similar to FIG. 3 but made up in a different way of presentation in order to illustrate the structural groups arranged inside and outside of the integrated circuit.

FIG. 4 basically shows the same block diagram as FIG. 3 but in a somewhat different arrangement. This is to illustrate that all structural groups 14 to 28 are arranged within one integrated circuit, while merely switches SA, SB, and SC lie outside of the same as an "external circuitry". The control terminals proper are nothing but the terminals 11, 12, and 13, while terminal 10 likewise used for control usually is available in microprocessors as a clock or counting input so that it requires no additional control "leg". Moreover, FIG. 4 more clearly shows that the binary coded signals applied in parallel to the terminals 11, 12, and 13 are produced externally and thus applied from outside to the integrated circuit 29. The pulses which succeed each other in time, on the other hand, are generated internally within the integrated circuit 29. Their output is effected at the terminals 11, 12, and 13, respectively, and they are returned through external circuitry (switches SA, SB, and SC) to the terminal 10 which, in this instance, serves as an "input terminal".

Figure 5:
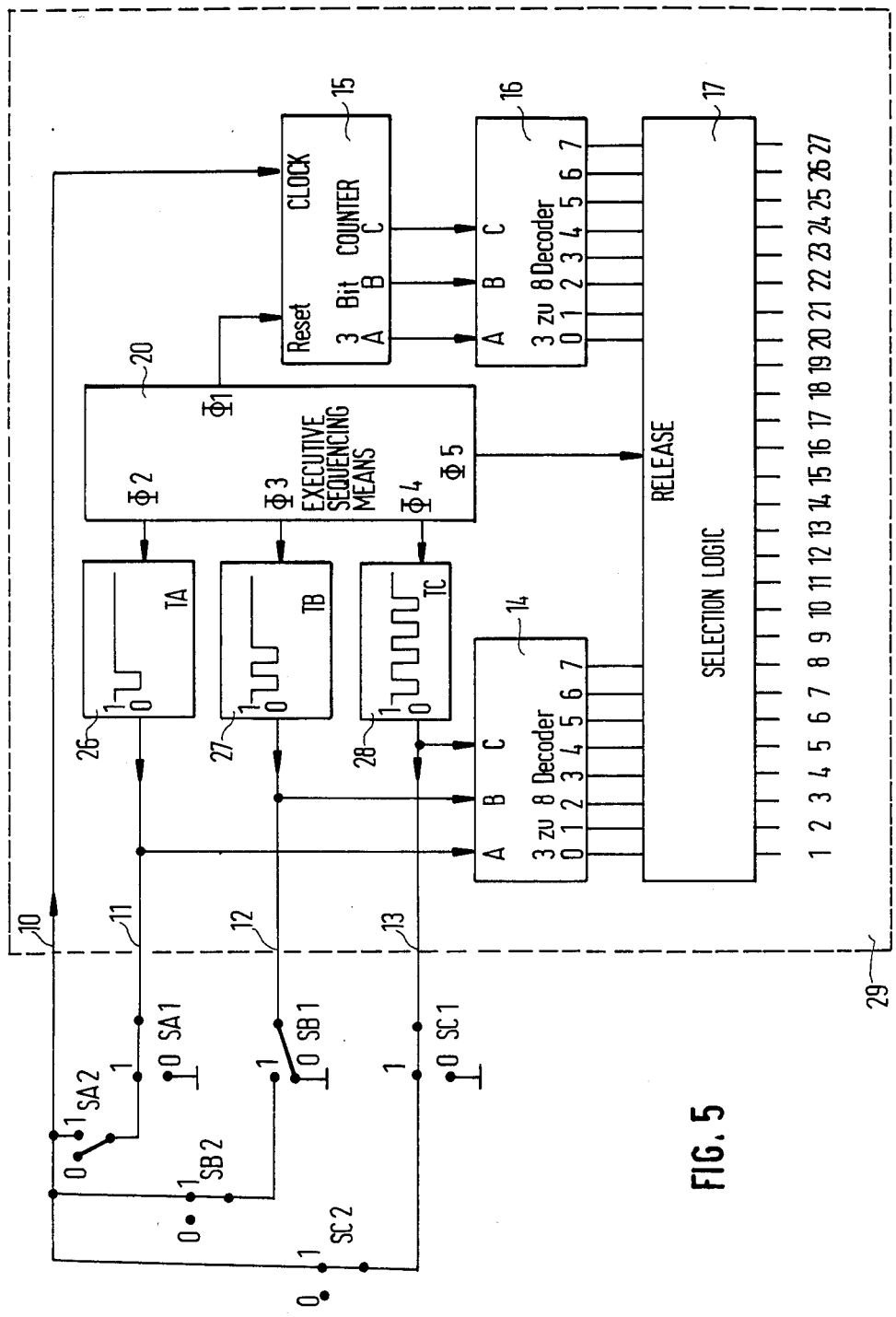
FIG. 5 is a block diagram similar to FIG. 4 showing a variant of the invention.

FIG. 5 shows a modification of the block diagram of FIG. 4. The structural elements required in connection with the invention in the interior of the integrated circuit 29 shown in FIG. 5 are identical with those of FIG. 4.

The only modification was made in the "external circuitry" of the terminals 10, 11, 12, and 13. Instead of using three switches each of which has three switching positions, six switches are provided in this case which each have two possible switching positions. The switches SA, SB, and SC of FIG. 4 were divided into two switches each, namely SA1, SA2; SB1, SB2; and SC1, SC2. As to their effect, they are connected in series such that the switching arm of the switch marked by index 2 is connected to the terminal marked "1" of the respective switch marked by index 1. The terminals marked "0" of the switches marked by index 1 are connected to ground so that the outputs of the corresponding pulse generators 26, 27, 28 connected to the same are shortcircuited. Even if the executive sequencing means 20 activates a corresponding pulse generator, the pulses thereof thus will not reach the input of the counter 15. Instead, this is possible only by one of those switches marked by index 1 which happens to be in condition "1". It is only then that the switches marked by index 2 are of interest as to their switching position in respect of the pulses arriving at the counter. The switches permit passage of the pulses when they are in their switching condition "1". In the switching condition "0", on the other hand, the pulses do not reach the terminal 10. The switching position "0" of switches SA2, SB2, and SC3 is an "open switching position". Grounding is not permitted because otherwise the switching condition "0" would appear at the corresponding terminal 11, 12, or 13, regardless of the position of the associated switch having index 1. If one studies all the possible permitted switching positions, in consideration of the above rules, again three possible switching combinations result with n switching pairs. These possible switching combinations may be taken from the table below in which a horizontal line designates invariant switching states which have no influence on any possible selection:

| SC1 | SB1 | SA1 | SC2 | SB2 | SA2 | selection |
|---|---|---|---|---|---|---|
| 0 | 0 | 0 | — | — | — | 0 |
| 0 | 0 | 1 | — | — | 0 | 1 |
| 0 | 0 | 1 | — | — | 1 | 2 |
| 0 | 1 | 0 | — | 0 | — | 3 |
| 0 | 1 | 0 | — | 1 | — | 4 |
| 0 | 1 | 1 | — | 0 | 0 | 5 |
| 0 | 1 | 1 | — | 0 | 1 | 6 |
| 0 | 1 | 1 | — | 1 | 0 | 7 |
| 0 | 1 | 1 | — | 1 | 1 | 8 |
| 1 | 0 | 0 | 0 | — | — | 9 |
| 1 | 0 | 0 | 1 | — | — | 10 |
| 1 | 0 | 1 | 0 | — | 0 | 11 |
| 1 | 0 | 1 | 0 | — | 1 | 12 |
| 1 | 0 | 1 | 1 | — | 0 | 13 |
| 1 | 0 | 1 | 1 | — | 1 | 14 |
| 1 | 1 | 0 | 0 | 0 | — | 15 |
| 1 | 1 | 0 | 0 | 1 | — | 16 |
| 1 | 1 | 0 | 1 | 0 | — | 17 |
| 1 | 1 | 0 | 1 | 1 | — | 18 |
| 1 | 1 | 1 | 0 | 0 | 0 | 19 |
| 1 | 1 | 1 | 0 | 0 | 1 | 20 |
| 1 | 1 | 1 | 0 | 1 | 0 | 21 |
| 1 | 1 | 1 | 0 | 1 | 1 | 22 |
| 1 | 1 | 1 | 1 | 0 | 0 | 23 |
| 1 | 1 | 1 | 1 | 0 | 1 | 24 |
| 1 | 1 | 1 | 1 | 1 | 0 | 25 |
| 1 | 1 | 1 | 1 | 1 | 1 | 26 |

In conclusion, it should be pointed out that the invention is applicable for the input as well as output of data, instructions, switching states, etc. in integrated circuits. The embodiments shown in FIGS. 1 to 5 start from the fact that the selection logic applies certain control instructions, addresses, etc. to the further structural groups (not shown) of the integrated circuit 29.

It is possible just as well to connect the terminals 10, 11, 12, and 13 to outputs of an integrated circuit which provides coded signals in analogy with switches SA, SB, and SC so that the circuit arrangement according to the invention will act as an output decoder which then has three outputs of which only one each may be activated at a time. In this context, furthermore, the executive sequencing means 20 and the pulse generators 26, 27, and 28 may be placed in the integrated circuit which then has n+3 outputs, namely the coded outputs (number n) corresponding to outputs 22, 23, and 24 of the executive sequencing means 20, the control outputs corresponding to outputs 21 and 25 of the executive sequencing means, and the counting output corresponding to terminal 10.

All technical details presented in the claims, specification, and drawing may be essential of the invention, both individually or in any desired combination.

What is claimed is:

1. A circuit arrangement comprising: a plurality of n different control terminals, where n is an integer greater than one;
   n different pulse generators, each generator being connected to a corresponding one of the terminals, each generator supplying a different number of pulses;
   sequencing means connected to all of said generators to insure that the pulses are interleaved in time so that each generator produces its pulses in such manner that pulses from any one generator cannot be in time coincidence with pulses from any other generator;
   first and second like decoders, each decoder having n inputs, each input of the first decoder being connected to a corresponding one of the control terminals;
   a serial input, parallel output clock counter, the counter having n outputs, each clock output being connected to a corresponding one of the inputs of the second decoder;
   said sequencing means selecting at least one of said generators and supplying the pulses from the selected generator in series to said counter; and
   selection logic means connected to the outputs of both decoders.

2. The arrangement of claim 1 wherein the sequencing means includes n different switches, each switch having one common terminal connected to a corresponding one of the control terminals, and first, second and third switching states, each switch, when in the first state connecting its terminal to the input of the counter, when in the second state connecting its terminal to a point free of any potential, and when in the third state grounding its terminal, and wherein the generators produce negative pulses and when inoperative produce a logical "1".

3. The arrangement of claim 2 wherein the sequencing means includes 2n different switches each having two switching states, these switches being arranged in n pairs, the switches in each pair being connected in series, each pair being connected both to the corresponding one of the control terminals and to the input of the counter.

4. The arrangement of claim 3 wherein the number of pulses produced by the generator is half the number of pulses produced by the generator and the number of pulses produced by the nth generator is twice as large as the number produced by the generator.

5. The arrangement of claim 1 wherein the sequencing means provides reset signals for the counter and release signals for the selection logic.

6. The arrangement of claim 1 wherein each decoder has an n input and a 2 to the nth power output.

7. The arrangement of claim 1 wherein the counter is an n bit binary counter.

8. The arrangement of claim 1 wherein the selection logic includes a plurality of 3 to the nth power AND gates, each gate having one input connected to a corresponding one of the outputs of the first decoder and having a second input connected to a corresponding one of the outputs of the second decoder in correspondance with the possible signal combinations.

* * * * *